US010964619B2

(12) United States Patent
Pfefferlein et al.

(10) Patent No.: US 10,964,619 B2
(45) Date of Patent: Mar. 30, 2021

(54) SEMICONDUCTOR ASSEMBLY

(71) Applicant: Siemens Aktiengesellschaft, Munich (DE)

(72) Inventors: Stefan Pfefferlein, Heroldsberg (DE); Thomas Bigl, Herzogenaurach (DE); Ewgenij Ochs, Fürth (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/958,067

(22) PCT Filed: Nov. 19, 2018

(86) PCT No.: PCT/EP2018/081734
§ 371 (c)(1),
(2) Date: Jun. 25, 2020

(87) PCT Pub. No.: WO2019/129421
PCT Pub. Date: Jul. 4, 2019

(65) Prior Publication Data
US 2021/0005529 A1    Jan. 7, 2021

(30) Foreign Application Priority Data

Dec. 29, 2017 (EP) .................. 17211136

(51) Int. Cl.
*H01L 23/10* (2006.01)
*H01L 23/34* (2006.01)
(Continued)

(52) U.S. Cl.
CPC ...... *H01L 23/3675* (2013.01); *H01L 21/4871* (2013.01); *H01L 23/49811* (2013.01); *H05K 7/209* (2013.01)

(58) Field of Classification Search
CPC ....... H01L 2224/48091; H01L 21/4871; H01L 2224/32145; H01L 23/36; H01L 23/13;
(Continued)

(56) References Cited

U.S. PATENT DOCUMENTS 6,583,505 B2 * 6/2003 Choi .................. H01L 24/97
257/730
6,630,734 B2 * 10/2003 Okamoto .............. C22C 1/1036
257/706
(Continued)

FOREIGN PATENT DOCUMENTS

DE     102015213495 A1    3/2016
EP         1420445 A1    5/2004
EP         2835326 A1    2/2015

OTHER PUBLICATIONS

PCT International Search Report and Written Opinion of International Searching Authority dated Feb. 1, 2019 correspondng to International Application No. PCT/EP2018/081734 filed Nov. 19, 2018.

*Primary Examiner* — S. V. Clark
(74) *Attorney, Agent, or Firm* — Henry M. Feiereisen LLC

(57) ABSTRACT

A semiconductor assembly includes a semiconductor element having contacts on a first surface electrically connected with contacts of a carrier element by electrically conductive material. A second surface opposite the first surface has a convex curvature with a first radius or a concave curvature with a second radius. The second surface of the convex curvature or the second surface of the concave curvature is connected in a positive-fit manner to a cooling body surface of a concave cooling body curvature of the cooling body, and, during operation at a selected barrier layer temperature, the first radius of the convex curvature deviates by at most 10% from a third radius of the concave cooling body
(Continued)

curvature, or the second radius of the concave curvature deviates by at most 10% from a fourth radius of the convex cooling body curvature.

17 Claims, 5 Drawing Sheets

(51) Int. Cl.
*H01L 23/367* (2006.01)
*H01L 23/498* (2006.01)
*H01L 21/48* (2006.01)
*H05K 7/20* (2006.01)

(58) Field of Classification Search
CPC ............... H01L 21/4882; H01L 23/367; H01L 23/3672; H01L 35/505
USPC .................. 257/706, 707, 712, 713; 438/122
See application file for complete search history.

(56) References Cited

U.S. PATENT DOCUMENTS

| | | | |
|---|---|---|---|
| 7,358,606 B2* | 4/2008 | Rumer | H01L 23/34 257/713 |
| 7,608,923 B2* | 10/2009 | Hsu | H01L 23/3192 257/675 |
| 2005/0139998 A1* | 6/2005 | Fitzgerald | H01L 23/3735 257/713 |
| 2015/0171028 A1* | 6/2015 | Jo | H01L 23/3128 257/713 |
| 2016/0071778 A1 | 3/2016 | Otsubo et al. | |
| 2016/0254209 A1* | 9/2016 | Oohiraki | H01L 21/52 257/707 |

* cited by examiner

SEMICONDUCTOR ASSEMBLY

CROSS-REFERENCES TO RELATED APPLICATIONS

This application is the U.S. National Stage of International Application No. PCT/EP2018/081734, filed Nov. 19, 2018, which designated the United States and has been published as International Publication No. WO 2019/129421 and which claims the priority of European Patent Application, Serial No. 17211136.1, filed Dec. 29, 2017, pursuant to 35 U.S.C. 119(a)-(d).

BACKGROUND OF THE INVENTION

The invention relates to a semiconductor assembly which comprises a semiconductor element with first contacts, a carrier element with second contacts and a cooling body. Furthermore, the invention relates to an inverter having the semiconductor assembly and a production method for the cooling body of the semiconductor assembly.

For the heat dissipation of semiconductor elements, for example, of power semiconductor switches in the form of IGBTs (Insulated-Gate Bipolar Transistor) or MOSFETs (Metal-Oxide Semiconductor Field Effect Transistor), which are generally electrically contacted on a carrier element, usually an electrical printed circuit board made of plastic, as a rule these semiconductor elements are mechanically connected via a ceramic substrate to a cooling body. This structural design can also be referred to as a semiconductor assembly.

Such semiconductor assemblies are used, in particular in inverters of electrical drive systems or in inverters of energy supply systems.

The semiconductor element is often electrically contacted with the carrier element for the semiconductor assembly by means of, for example, a solder connection or a sintered connection. From the point of view of the thermal and electrical design of the semiconductor assembly, the production of the electrical contacting of the semiconductor element with the carrier element usually results in considerable deformations both on the semiconductor element and on the carrier element.

The development of heat when creating the solder connection or the sintered connection during the production process, and the subsequent cooling to an ambient or room temperature, give rise to these deformations due to the different thermal expansion coefficient of the semiconductor element and the carrier element which are mechanically connected to one another in a positively guided manner via electrical contacts by means of the solder connection or the sintered connection.

Thus, for example, the carrier element can be more deformed in the course of the supply of heat during the soldering process than the semiconductor element, a complete regression of the deformation of the semiconductor element being prevented as a result of these different deformation processes after cooling to, for example, the ambient temperature.

These deformation processes consequently occur in particular in the case of direct material connection under the influence of temperature, as is the case in contrast to the later operating temperature, for example, when soldering electrical flat modules.

Thus, these deformations then often appear in the form of curvatures on the surfaces, on the one hand, of the semiconductor element, for example, on a surface of a ceramic substrate by means of which the semiconductor element is connected to a surface of the cooling body, and on the other hand, on the surfaces of the carrier element.

A problem that has not yet been adequately solved is that, for example, the mechanical/thermal connection of the semiconductor element to the cooling body should be available over all the surfaces relevant for the thermal connection of the two components in a manner which is as plane-parallel and positive-fitting as possible, in particular when the semiconductor element achieves operating states requiring maximum heat dissipation from the semiconductor element to the cooling body.

Today the undesirable characteristics of the aforementioned temperature-dependent deformations or curvatures can only be at least partially influenced by means of complex and costly measures such as, for example, material combinations of the semiconductor element and the carrier element, compensating layers between the mechanical and electrical connections and an optimum ratio of join temperature to operating temperature of the aforementioned electrical components for the production of the mechanical and electrical connections. Despite these measures, it is often not possible to prevent mechanical/thermal connection of the semiconductor element to the cooling body from only occurring at some points of the two relevant surfaces of these components during operating states which are particularly critical for heat dissipation.

The object of the invention is therefore to provide a semiconductor assembly, in particular also for an inverter, in which a mechanical/thermal connection of a semiconductor element of the semiconductor assembly to a cooling body of the semiconductor assembly takes place in a positive-fit manner, to the greatest possible extent over all the thermally relevant surfaces of the components during selected operating states of the semiconductor component, and to provide a simple and cost-effective method of producing the cooling body for the semiconductor assembly.

SUMMARY OF THE INVENTION

The object is achieved by a semiconductor assembly as set forth hereinafter. Furthermore, the object is achieved by an inverter and a production method as set forth hereinafter.

The invention is based, inter alia, on the knowledge that as a rule the thermal expansion coefficient of a semiconductor element is smaller than, for example, that of a printed circuit board as the carrier element of the semiconductor element. For switchable power semiconductor elements, for example, ceramic substrates are usually used for electrical insulation with respect to the cooling body and thus form a substantial thermal transition to the cooling body.

The often widely varying thermal expansion coefficients of the ceramic substrate of the semiconductor element and the carrier element are therefore a major reason, usually regardless of the specific operating states of the semiconductor element, for a deformation of the ceramic substrate mentioned here by way of example persisting. This has hitherto prevented the most targeted possible positive-fit mechanical connection of the thermally relevant convex surface of the semiconductor element to the thermally relevant flat surface of the cooling body.

By means of a targeted deformation of the cooling body surface of the cooling body, in particular for the operating states of the semiconductor element with a high need for heat dissipation, an improved positive-fit mechanical connection of the thermally relevant convex surface of the semiconductor element to the thermally relevant cooling body surface of the cooling body can be obtained.

To achieve the object, a semiconductor assembly is proposed comprising a semiconductor element with first contacts, a carrier element with second contacts and a cooling body, wherein the first contacts, arranged on a first surface, facing toward the carrier element, of the semiconductor element, are electrically connected by means of electrically conductive material to the second contacts of the carrier element, wherein the semiconductor element has, on a second surface situated opposite the first surface, a convex curvature with a first radius or a concave curvature with a second radius, wherein the semiconductor element is, on the second surface of the convex curvature, connected in a positive-fit manner to a cooling body surface of a concave cooling body curvature of the cooling body and, during operation at a selected barrier layer temperature, the first radius of the convex curvature deviates by at most 10% from a third radius of the concave cooling body curvature or wherein the semiconductor element is, on the second surface of the concave curvature, connected in a positive-fit manner to a cooling body surface of a convex cooling body curvature of the cooling body and, during operation at a selected barrier layer temperature, the second radius of the concave curvature deviates by at most 10% from a fourth radius of the convex cooling body curvature.

Depending on the characteristics of the type of curvature as a concave or convex curvature of the second surface of the semiconductor element, the cooling body is advantageously designed on its cooling body surface with a corresponding prefabricated convex or concave cooling body curvature which, during operation of the semiconductor element at the selected barrier layer temperature, that is to say, in particular in an operating state requiring the best possible heat dissipation from the semiconductor element, forms a deviation of at most 10% of the radii of the respective curvatures of the semiconductor element from the radii of the respective cooling body curvatures.

This deviation of the aforementioned radii also makes it possible to indirectly detect the quality of the positive-fit connection.

The slight deviation of the aforementioned radii by at most 10% therefore advantageously forms an almost complete positive-fit mechanical/thermal connection of the second surface of the semiconductor element to the cooling body surface of the cooling body relevant for the heat dissipation of the semiconductor element.

Advantageous embodiments of the semiconductor assembly are specified in the dependent claims.

In a first advantageous embodiment of the semiconductor assembly, the semiconductor element can be operated at the selected barrier layer temperature from a range of values between 50% of a maximum barrier layer temperature of the semiconductor element and the maximum barrier layer temperature of the semiconductor element inclusive.

The operation of the semiconductor element by means of the selected barrier layer temperature from this range of values advantageously covers the actual operating states of the semiconductor element for which, in particular, reliable and efficient operation of the semiconductor element and, associated therewith, reliable and efficient heat dissipation from the semiconductor element are required.

In a further advantageous embodiment of the semiconductor assembly, a first thermal expansion coefficient of the semiconductor element is smaller than a second thermal expansion coefficient of the carrier element.

In this embodiment of the semiconductor assembly, the convex curvature is formed on the second surface of the semiconductor element, which convex curvature is advantageously connected in a positive-fit manner to the cooling body surface of the concave cooling body curvature of the cooling body, depending on the selected barrier layer temperature within 10% of the deviation of the first radius of the convex curvatures of the semiconductor element from the third radius of the concave cooling body curvatures of the cooling body.

In a further advantageous embodiment of the semiconductor assembly, irregularities in the material of the second surface of the convex curvature of the semiconductor element and/or the cooling body surface of the concave cooling body curvature of the cooling body are smoothed out by heat-conducting means.

The irregularities in the material of the second surface of the convex curvature of the semiconductor element and/or the cooling body surface of the concave cooling body curvature of the cooling body are not comparable with gaps in the mechanical connection between the second surface of the convex curvature of the semiconductor element and the cooling body surface of the concave cooling body curvature of the cooling body which occur when a positive-fit connection to the aforementioned surfaces cannot be produced over a large surface area and/or at certain points.

Oil or comparable heat-conductive materials, which in particular are in a liquid state, are used, for example, as a heat-conducting material which is intended to smooth out the irregularities in the material, in particular pores in the material structure of the material surfaces.

In a further advantageous embodiment of the semiconductor assembly, a first thermal expansion coefficient of the semiconductor element is greater than a second thermal expansion coefficient of the carrier element.

In this embodiment of the semiconductor assembly, the concave curvature is formed on the second surface of the semiconductor element, which concave curvature advantageously is connected in a positive-fit manner to the cooling body surface of the convex cooling body curvature of the cooling body, depending on the barrier layer temperature selected within 10% of the deviation of the second radius of the concave curvatures of the semiconductor element from the fourth radius of the convex cooling body curvatures of the cooling body.

In a further advantageous embodiment of the semiconductor assembly, irregularities in the material of the second surface of the concave curvature of the semiconductor element and/or the cooling body surface of the convex cooling body curvature of the cooling body are smoothed out by heat-conducting means.

The irregularities in the material of the second surface of the concave curvature of the semiconductor element and/or the cooling body surface of the convex cooling body curvature of the cooling body are not comparable with gaps in the mechanical connection between the second surface of the concave curvature of the semiconductor element and the cooling body surface of the convex cooling body curvature of the cooling body which occur when a positive-fit connection to the aforementioned surfaces cannot be produced over a large surface area and/or at certain points.

Oil or comparable heat-conductive materials, which in particular are in a liquid state, are used, for example, as a heat-conducting material which is intended to smooth out the irregularities in the material, in particular pores in the material structure of the material surfaces.

The invention also relates to an inverter having a semiconductor assembly according to the invention, wherein the inverter can be electrically connected to an electrical network and an electrical machine and wherein the electrical machine can be operated by the inverter by means of electrical energy from the electrical network.

The invention furthermore relates to a production method for producing a cooling body for a semiconductor assembly according to the invention, comprising the following method steps:

First determination of a first radius of a convex curvature of a second surface of a semiconductor element, having at least one ambient temperature, or first determination of a second radius of a concave curvature of a second surface of a semiconductor element, having at least one ambient temperature, wherein in each case the second surface is arranged opposite a first surface of the semiconductor element which is facing toward a carrier element electrically connected to the semiconductor element, Second determination of the first radius of the convex curvature of the second surface of the semiconductor element, operated at a selected barrier layer temperature, or second determination of the second radius of the concave curvature of the second surface of the semiconductor element, operated at a selected barrier layer temperature, Comparison of the first radius determined at least at the ambient temperature, with the first radius determined at the selected barrier layer temperature, or comparison of the second radius determined at least at the ambient temperature, with the second radius determined at the selected barrier layer temperature, and Production of a concave cooling body curvature of a cooling body surface of the cooling body with a third radius which is equal to the first radius at the selected barrier layer temperature when the first radius is smaller at least at the ambient temperature than the first radius at the selected barrier layer temperature, or production of a convex cooling body curvature of a cooling body surface of the cooling body with a fourth radius which is equal to the second radius at the selected barrier layer temperature when the second radius is greater at least at the ambient temperature than the second radius at the selected barrier layer temperature.

The first determination method step is carried out under conditions in which the carrier element and the semiconductor element are already connected electrically and thus also mechanically to one another via their contacts and an electrically conductive material, and the semiconductor element has assumed at least the ambient temperature.

The first radius of the convex curvature of the second surface of the semiconductor element or the second radius of the concave curvature of the second surface of the semiconductor element is thus determined.

For the second determination method step, the semiconductor element is operated at the selected barrier layer temperature. This selected barrier layer temperature is selected according to the requirements of operational application scenarios of the semiconductor element, that is to say, for example, selected for a mode of operation in which the semiconductor element is operated close to its maximum capacity and/or in which the semiconductor element is predominantly operated over its entire operating life.

The semiconductor element is therefore operated at the selected barrier layer temperature in order to now determine the first radius of the convex curvature of the second surface of the semiconductor element or the second radius of the concave curvature of the second surface of the semiconductor element under these conditions.

In general, this means that, depending on the semiconductor element, the selected barrier layer temperature is significantly greater than the ambient temperature of the semiconductor element.

In the comparison method step, it is evaluated whether the first radius which was determined under the conditions of the semiconductor element being at least at the ambient temperature is greater or smaller than the first radius which was determined under the conditions of operation of the semiconductor element at the selected barrier layer temperature, or whether the second radius which was determined under the conditions of the semiconductor element being at least at the ambient temperature, is smaller or greater than the second radius which was determined under the conditions of operation of the semiconductor element at the selected barrier layer temperature.

For the production of the concave cooling body curvature of the cooling body surface of the cooling body, the third radius of the concave cooling body curvature should now be equal to the first radius which was determined during operation of the semiconductor element at the selected barrier layer temperature. For this purpose, it is checked whether the first radius which was determined at least at the ambient temperature is smaller than the first radius which was determined at the selected barrier layer temperature, in order to check the concave type of required cooling body curvature of the cooling body surface of the cooling body necessary here.

The approach for the production of the convex cooling body curvature of the cooling body surface of the cooling body, in which the fourth radius of the convex cooling body curvature should be equal to the second radius which was determined during operation of the semiconductor element at the selected barrier layer temperature, is comparable to the production of the concave cooling body curvature of the cooling body surface of the cooling body. For this purpose, it is checked whether the second radius which was determined at least at ambient temperature is greater than the second radius which was determined at the selected barrier layer temperature in order to likewise check the convex nature of the required cooling body curvature of the cooling body surface of the cooling body.

The concave or convex cooling body curvature of the cooling body advantageously determined in this way in each case can then be produced by means of milling, but also by means of 3D printing and comparable material-removing or material-applying technologies.

In an advantageous embodiment of the production method, in the first determination method step the semiconductor element is in an electrically inoperative state.

The inoperative state in which the semiconductor element is in this embodiment during the first determination method step in each case advantageously supports the determination of the first radius of the convex curvature or the determination of the second radius of the concave curvature of the second surface of the semiconductor element at precisely that ambient temperature as the semiconductor element can only assume the ambient temperature here during the first determination.

In an advantageous embodiment of the production method, the semiconductor element has an ambient temperature in the range of a value greater than 0° C. to 30° C. during the first determination method step.

Ambient temperatures can also be room temperatures in industrial environments, which in a technical context can certainly also include temperatures between greater than 0° C. to 30° C., for example for the use of components in inverters of industrial plants or for production premises for producing components for such inverters.

In a further advantageous embodiment of the production method, during the first determination method step the semiconductor element is electrically operated at a barrier layer temperature of less than 50% of a maximum barrier layer temperature of the semiconductor element and when the barrier layer temperature is higher than the ambient temperature in the comparison and production method steps, the ambient temperature is replaced by the higher barrier layer temperature.

In this exemplary application, for the first determination method step the semiconductor element can also be operated at a barrier layer temperature which is advantageously greater than the ambient temperature but still less than 50% of the maximum barrier layer temperature of the semiconductor element. Thus, if necessary (for example, ambient temperature less than or equal to 0° C.), in addition to the ambient temperature, a defined temperature can also be generated as a replacement for the ambient temperature during the first determination method step.

In a further advantageous embodiment of the production method, for the second determination method step, the selected barrier layer temperature is determined from a range of values between 50% of the maximum barrier layer temperature of the semiconductor element and the maximum barrier layer temperature of the semiconductor element inclusive and the semiconductor element operated at this selected barrier layer temperature.

The operation of the semiconductor element by means of the selected barrier layer temperature from this range of values for the second determination method step advantageously covers the subsequent operating states of the semiconductor element requiring reliable and efficient operation of the semiconductor element as well as reliable and efficient heat dissipation from the semiconductor element.

BRIEF DESCRIPTION OF THE DRAWING

The aforementioned properties, features and advantages of this invention and the way in which these are achieved will become clearer and more understandable with reference to the following description of the exemplary embodiments which are explained in more detail with reference to the figures, in which.

DETAILED DESCRIPTION OF PREFERRED EMBODIMENTS

Figure 1:
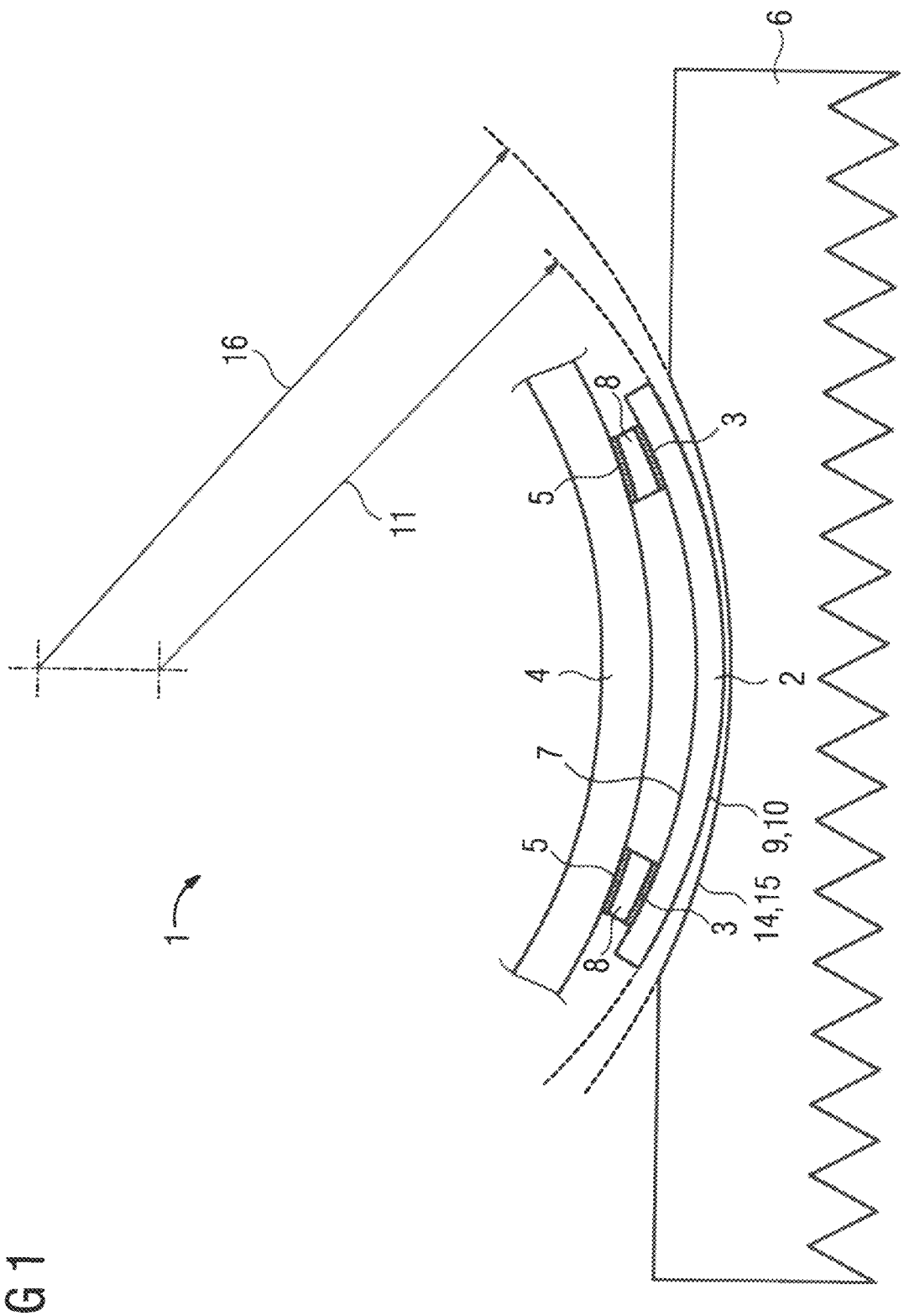
FIG. 1 shows a schematic view of an inventive semiconductor assembly having a connection of a convex curvature of a semiconductor element of the semiconductor assembly to a concave cooling body curvature of a cooling body of the semiconductor assembly, wherein the semiconductor element has, for example, at least one ambient temperature and/or is in an electrically inoperative state.

FIG. 1 shows a schematic view of an inventive semiconductor assembly 1 with a mechanical/thermal connection (implied in FIG. 1 for graphical reasons) of a convex curvature 10 of a semiconductor element 2 of the semiconductor assembly 1 to a concave cooling body curvature 15 of a cooling body 6 of the semiconductor assembly 1, wherein the semiconductor element 2 has, for example, at least one ambient temperature and/or is in an electrically inoperative state (neither is shown explicitly in FIG. 1).

According to FIG. 1, the semiconductor assembly 1 therefore comprises the semiconductor element 2 with first contacts 3, a carrier element 4 with second contacts 5 and the cooling body 6. The first contacts 3, which are arranged on a first surface 7 facing toward the carrier element 4 of the semiconductor element 2, connect the semiconductor element 2 electrically via an electrically conductive material 8 to the second contacts 5 of the carrier element 4.

Furthermore, FIG. 1 shows, on the second surface 9 of the semiconductor element 2 situated opposite the first surface 7 of the semiconductor element 2, the convex curvature 10 of the semiconductor element 2 with a first radius 11 and the concave cooling body curvature 15 of the cooling body 6 with a third radius 16 on a cooling body surface 14 of the cooling body 6.

Here FIG. 1 clearly visualizes the curvatures or deformations of the semiconductor element 2, the carrier element 4 and the cooling body surface 14 of the cooling body 6 in a graphically exaggerated manner. These curvatures are actually very small and are in technical reality, for example, in the range of a few micrometers.

FIG. 1 also clearly shows the difference in size of the first radius 11 of the convex curvature 10 of the second surface 9 of the semiconductor element 2 in comparison with the third radius 16 of the concave cooling body curvature 15 of the cooling body surface 14 of the cooling body 6.

A desired positive-fit connection of the convex curvature 10 of the second surface 9 of the semiconductor element 2 to the concave cooling body curvature 15 of the cooling body surface 14 of the cooling body 6 is hardly present in FIG. 1 or is only present at certain points, which implies that the semiconductor element 2 of the semiconductor assembly 1 is, for example, not in operation electrically and is only at the ambient temperature or is operated, for example, close to its ambient temperature at a low barrier layer temperature of less than 50% of the maximum barrier layer temperature.

Figure 2:
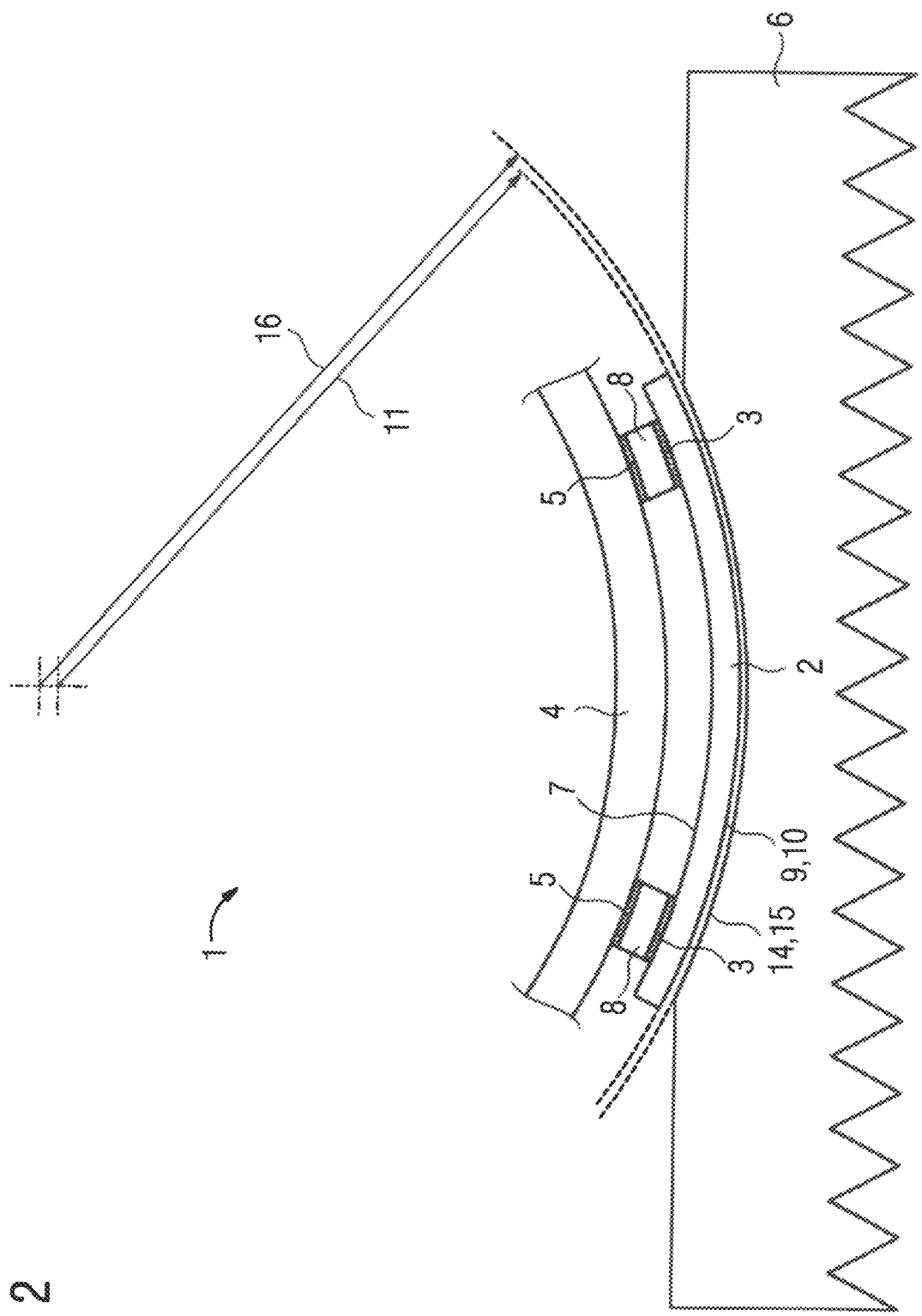
FIG. 2 shows a second schematic view of the inventive semiconductor assembly according to FIG. 1 having a connection of a convex curvature of the semiconductor element of the semiconductor assembly to the concave cooling body curvature of the cooling body of the semiconductor assembly, wherein the semiconductor element is operated at a selected barrier layer temperature.

FIG. 2 shows a second schematic view of the inventive semiconductor assembly 1 according to FIG. 1 with a mechanical/thermal connection (implied in FIG. 2 for graphical reasons) of a convex curvature 10 of the semiconductor element 2 of the semiconductor assembly 1 with the concave cooling body curvature 15 of the cooling body 6 of the semiconductor assembly 1, wherein the semiconductor element 2 is operated at a selected barrier layer temperature (not shown explicitly in FIG. 2).

According to FIG. 2, comparable to FIG. 1, the semiconductor assembly 1 comprises the semiconductor element 2 with first contacts 3, the carrier element 4 with second contacts 5 and the cooling body 6. The first contacts 3, which are arranged on the first surface 7 of the semiconductor element 2 facing toward the carrier element 4, connect the semiconductor element 2 electrically via the electrically conductive material 8 to the second contacts 5 of the carrier element 4.

Furthermore, FIG. 2 also shows, on the second surface 9 of the semiconductor element 2 situated opposite the first surface 7 of the semiconductor element 2, the convex curvature 10 of the semiconductor element 2 with the first radius 11 and the concave cooling body curvature 15 of the cooling body 6 with the third radius 16 on a cooling body surface 14 of the cooling body 6.

Here too, FIG. 2 clearly visualizes the curvatures or deformations of the semiconductor element 2, the carrier element 4 and the cooling body surface 14 of the cooling body 6 in a graphically exaggerated manner.

However, it is equally clear from FIG. 2 that a deviation of the first radius 11 of the convex curvature 10 of the second surface 9 of the semiconductor element 2 from the third radius 16 of the concave cooling body curvature 15 of the cooling body surface 14 of the cooling body 6 is in a range of at most 10%.

A desired positive-fit connection of the convex curvature 10 of the second surface 9 of the semiconductor element 2 to the concave cooling body curvature 15 of the cooling body surface 14 of the cooling body 6 is therefore essentially present in FIG. 2, which implies that the semiconductor element 2 of the semiconductor assembly 1 is electrically operated at a selected barrier layer temperature which is in a range of between 50% of the maximum barrier layer temperature and the maximum barrier layer temperature of the semiconductor element 2.

Figure 3:
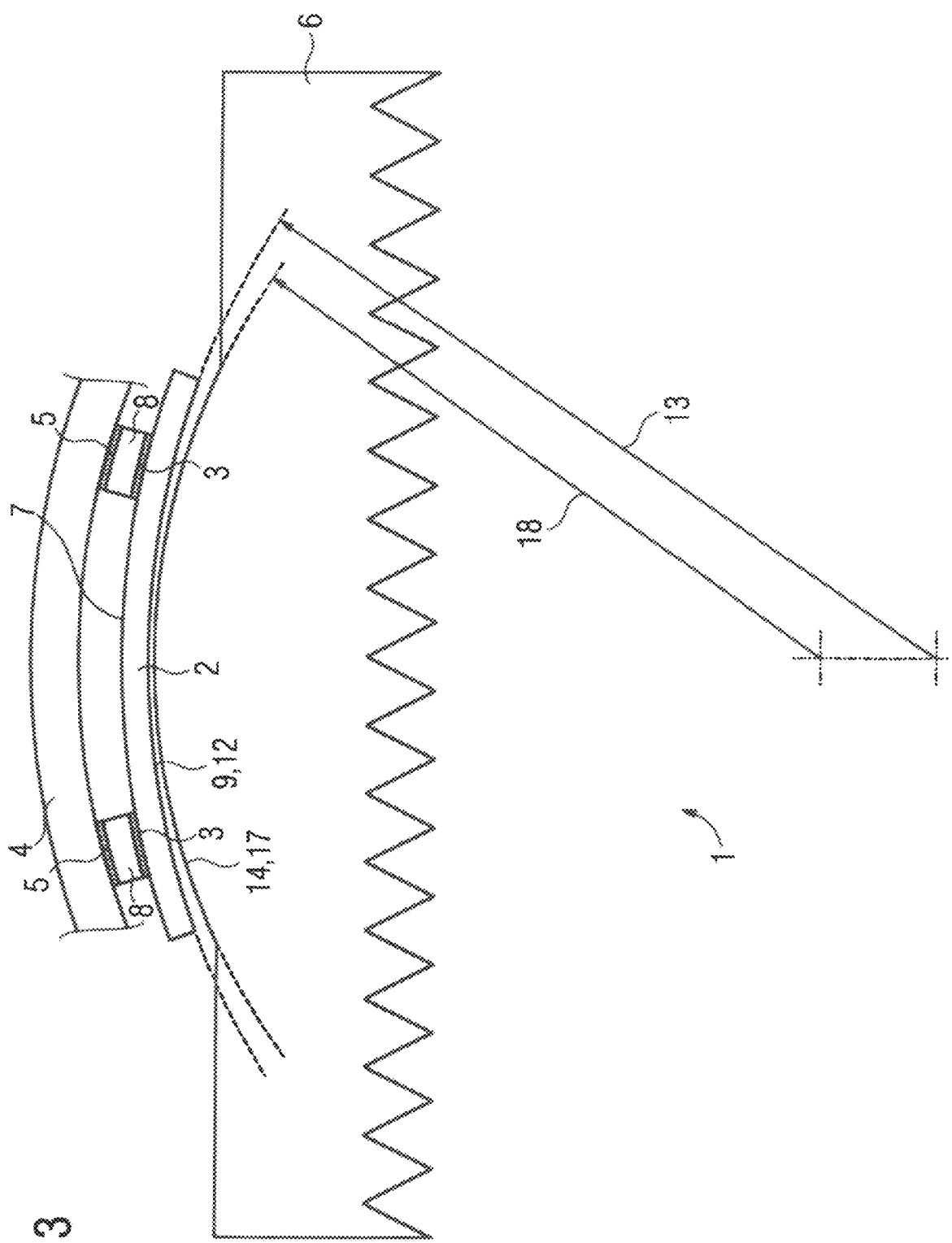
FIG. 3 shows a further schematic view of an inventive semiconductor assembly having a connection of a concave curvature of a semiconductor element of the semiconductor assembly to a convex cooling body curvature of a cooling body of the semiconductor assembly, wherein the semiconductor element has, for example, at least one ambient temperature and/or is in an electrically inoperative state.

FIG. 3 shows a further schematic view of an inventive semiconductor assembly 1 now with a mechanical/thermal connection (implied in FIG. 3 for graphical reasons) of a concave curvature 12 of a semiconductor element 2 of the semiconductor assembly 1 with a convex cooling body curvature 17 of a cooling body 6 of the semiconductor assembly 1, wherein the semiconductor element 2 has, for example, at least one ambient temperature and/or is in an electrically inoperative state (neither is shown explicitly in FIG. 3).

According to FIG. 3, the semiconductor assembly 1 therefore comprises the semiconductor element 2 with first contacts 3, a carrier element 4 with second contacts 5 and the cooling body 6. The first contacts 3, which are arranged on a first surface 7 of the semiconductor element 2 facing toward the carrier element 4, connect the semiconductor element 2 electrically via an electrically conductive material 8 to the second contacts 5 of the carrier element 4.

Furthermore, FIG. 3 shows, on the second surface 9 of the semiconductor element 2 situated opposite the first surface 7 of the semiconductor element 2, the concave curvature 12 of the semiconductor element 2 with a second radius 13 and the convex cooling body curvature 17 of the cooling body 6 with a fourth radius 18 on a cooling body surface 14 of the cooling body 6.

Here FIG. 3 clearly visualizes the curvatures or deformations of the semiconductor element 2, the carrier element 4 and the cooling body surface 14 of the cooling body 6 in a graphically exaggerated manner.

FIG. 3 also clearly shows the difference in size of the second radius 12 of the concave curvature 12 of the second surface 9 of the semiconductor element 2 in comparison with the fourth radius 18 of the convex cooling body curvature 17 of the cooling body surface 14 of the cooling body 6.

A desired positive connection of the concave curvature 12 of the second surface 9 of the semiconductor element 2 to the convex cooling body curvature 17 of the cooling body surface 14 of the cooling body 6 is hardly present in FIG. 3 or only at certain points, which implies that the semiconductor element 2 of the semiconductor assembly 1 is, for example, not in operation electrically and is only at the ambient temperature or is operated, for example, close to its ambient temperature at a low barrier layer temperature of less than 50% of the maximum barrier layer temperature.

Figure 4:
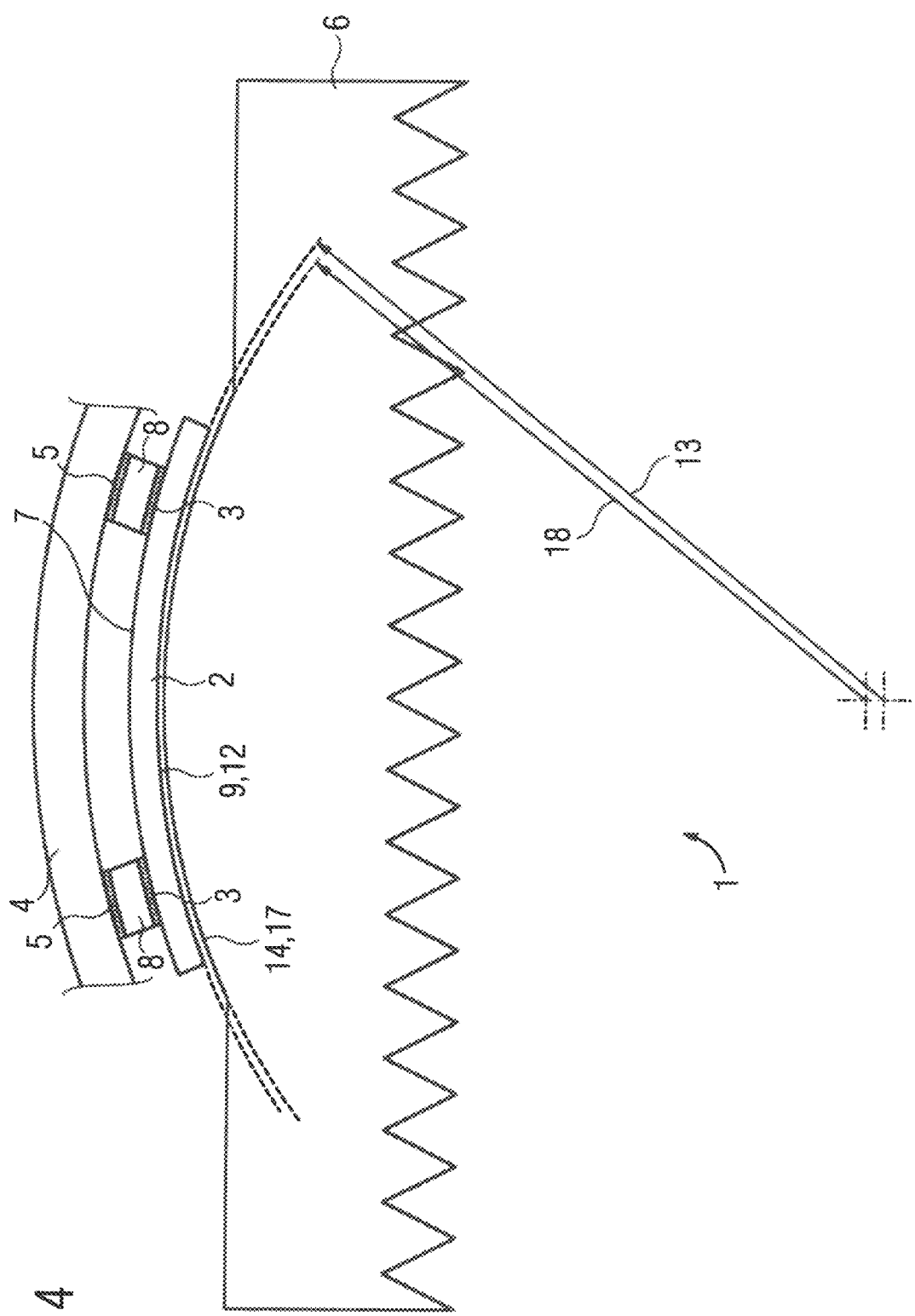
FIG. 4 shows a second schematic view of the inventive semiconductor assembly according to FIG. 3 having a mechanical/thermal connection of a concave curvature of the semiconductor element of the semiconductor assembly to the convex cooling body curvature of the cooling body of the semiconductor assembly, wherein the semiconductor element is operated at a selected barrier layer temperature.

FIG. 4 shows a second schematic view of the inventive semiconductor assembly 1 according to FIG. 3 with a mechanical/thermal connection (implied in FIG. 4 for graphical reasons) of a concave curvature 12 of the semiconductor element 2 of the semiconductor assembly 1 with the convex cooling body curvature 17 of the cooling body 6 of the semiconductor assembly 1, wherein the semiconductor element 2 is operated at a selected barrier layer temperature (not shown explicitly in FIG. 4).

According to FIG. 4, comparable to FIG. 3, the semiconductor assembly 1 comprises the semiconductor element 2 with first contacts 3, the carrier element 4 with second contacts 5 and the cooling body 6. The first contacts 3, which are arranged on the first surface 7 of the semiconductor element 2 facing toward the carrier element 4, connect the semiconductor element 2 electrically via the electrically conductive material 8 to the second contacts 5 of the carrier element 4.

Furthermore, FIG. 4 also shows, on the second surface 9 of the semiconductor element 2 situated opposite the first surface 7 of the semiconductor element 2, the concave curvature 12 of the semiconductor element 2 with the second radius 13 and the convex cooling body curvature 17 of the cooling body 6 with the fourth radius 18 on a cooling body surface 14 of the cooling body 6.

Here too, FIG. 4 clearly visualizes the curvatures or deformations of the semiconductor element 2, the carrier element 4 and the cooling body surface 14 of the cooling body 6 in a graphically exaggerated manner.

However, it is equally clear from FIG. 4 that a deviation of the second radius 13 of the convex curvature 12 of the second surface 9 of the semiconductor element 2 from the fourth radius 18 of the convex cooling body curvature 17 of the cooling body surface 14 of the cooling body 6 is in a range of at most 10%.

A desired positive-fit connection of the concave curvature 12 of the second surface 9 of the semiconductor element 2 to the convex cooling body curvature 17 of the cooling body surface 14 of the cooling body 6 is therefore essentially present in FIG. 4, which implies that the semiconductor element 2 of the semiconductor assembly 1 is electrically operated at a selected barrier layer temperature which is in a range of between 50% of the maximum barrier layer temperature and the maximum barrier layer temperature of the semiconductor element 2.

Figure 5:
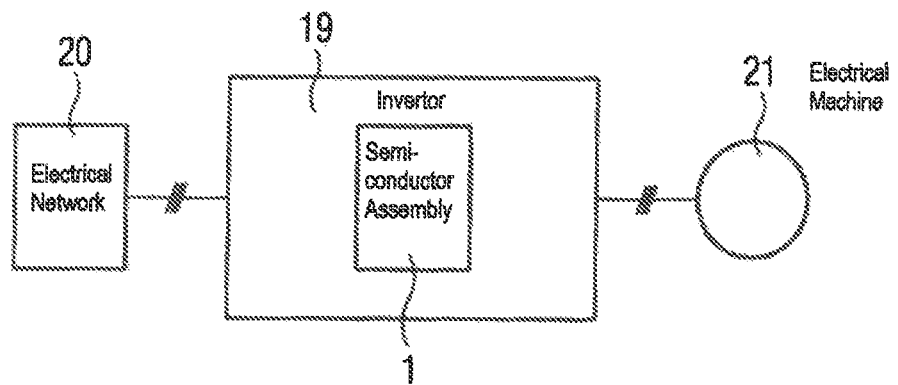
FIG. 5 shows a schematic circuit diagram of an inverter having an inventive semiconductor assembly according to one of FIGS. 1 to 4 and FIG. 6 shows a structure chart with a production method for producing a cooling body for an inventive semiconductor assembly according to one of FIGS. 1 to 4.

FIG. 5 shows a schematic circuit diagram of an inverter 19 with an inventive semiconductor assembly 1 according to one of FIGS. 1 to 4.

The inverter 19 is electrically connected to an electrical network 20 and to an electrical machine 21. The electrical connection is shown in FIG. 5 as a three-phase current connection in each case. During the operation of the inverter 19, electrical energy is provided by the electrical network 20, by means of which the inverter 19 operates the electrical machine 21 using the semiconductor assembly 1.

Figure 6:
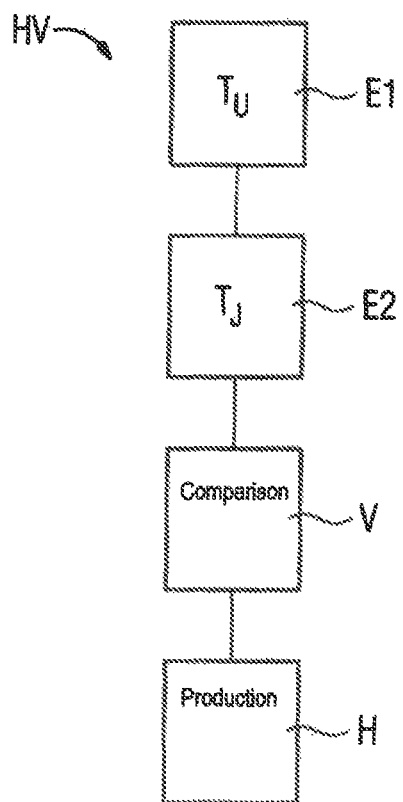

FIG. 6 shows a structure chart with a production method HV for producing a cooling body for an inventive semiconductor assembly according to one of FIGS. 1 to 4.

The production method HV for producing the cooling body for the inventive semiconductor assembly comprises the method steps of first determination E1, second determination E2, comparison V and production H.

In the case of first determination E1, the first radius of the convex curvature of the second surface of the semiconductor element, which is at least at the ambient temperature $T_U$, or the second radius of the concave curvature of the second surface of the semiconductor element, which is at least at the ambient temperature $T_U$, is determined. In each case, the second surface of the semiconductor element is situated opposite the first surface of the semiconductor element, wherein the first surface of the semiconductor element is facing toward the carrier element electrically connected thereto.

The first determination method step E1 is carried out under conditions in which the carrier element and the semiconductor element are already connected electrically and thus also mechanically to one another via their contacts and the electrically conductive material, and the semiconductor element has assumed at least the ambient temperature $T_U$.

In the second determination method step E2, the first radius of the convex curvature of the second surface of the semiconductor element, which is operated at a selected barrier layer temperature $T_J$, is determined or the second radius of the concave curvature of the second surface of the semiconductor element, which is operated at a selected barrier layer temperature $T_J$, is determined.

The second determination method step E2 is consequently carried out under conditions in which the semiconductor element is operated at the selected barrier layer temperature $T_J$. This selected barrier layer temperature $T_J$ is selected according to the requirements of operational application scenarios of the semiconductor element, that is to say, for example, selected for a mode of operation in which the semiconductor element is operated close to its maximum capacity and/or in which the semiconductor element is predominantly operated over its entire operating life.

In the comparison V, the first radius determined at least at ambient temperature $T_U$ is compared with the first radius determined at the selected barrier layer temperature $T_J$, or the second radius determined at least at ambient temperature $T_U$ is compared with the second radius determined at the selected barrier layer temperature $T_J$.

In the comparison method step V, it is therefore evaluated whether the first radius which was determined under the conditions of the semiconductor element having at least the ambient temperature $T_U$ is greater or smaller than the first radius which was determined under the conditions of operation of the semiconductor element at the selected barrier layer temperature $T_J$, or whether the second radius which was determined under the conditions of the semiconductor element having at least the ambient temperature $T_U$ is smaller or greater than the second radius which was determined under the conditions of operation of the semiconductor element at the selected barrier layer temperature $T_J$.

In the production H of the concave cooling body curvature of the cooling body surface of the cooling body with the third radius, this third radius is equal to the first radius at the selected barrier layer temperature $T_J$ when the first radius at least at the ambient temperature $T_U$ is smaller than the first radius at the selected barrier layer temperature $T_J$.

In the production method step H of the concave cooling body curvature of the cooling body surface of the cooling body, the third radius of the concave cooling body curvature should now be equal to the first radius which was determined during the operation of the semiconductor element at the selected barrier layer temperature $T_J$. For this purpose, it is checked whether the first radius which was determined at least at the ambient temperature $T_U$ is smaller than the first radius which was determined at the selected barrier layer temperature $T_J$ in order to check the concave nature of the required cooling body curvature of the cooling body surface of the cooling body required here.

In the production H of the convex cooling body curvature of the cooling body surface of the cooling body with the fourth radius, this fourth radius is equal to the second radius at the selected barrier layer temperature $T_J$ when the second radius at least at the ambient temperature $T_U$ is greater than the second radius at the selected barrier layer temperature $T_J$.

Comparable to the production method step H of the concave cooling body curvature of the cooling body surface of the cooling body, in the production method step H of the convex cooling body curvature of the cooling body surface of the cooling body, the fourth radius of the convex cooling body curvature should now be equal to the second radius which was determined during operation of the semiconductor element at the selected barrier layer temperature $T_J$. For this purpose, it is checked whether the second radius which was determined at least at the ambient temperature $T_J$ is greater than the second radius which was determined at the selected barrier layer temperature $T_J$ In order to check the convex nature of the required cooling body curvature of the cooling body surface of the cooling body required here.

What is claimed is:

1. A semiconductor assembly, comprising:
   a carrier element having contacts;
   a semiconductor element having a first surface which faces toward the carrier element, a second surface situated opposite the first surface and having a convex curvature with a first radius or a concave curvature with a second radius, and contacts arranged on the first surface;
   an electrically conductive material electrically connecting the contacts of the semiconductor element to the contacts of the carrier element; and
   a cooling body having a cooling body surface which is connected in one of two ways,
   a first way in which the cooling body surface has a concave cooling body curvature and is connected to the second surface of the convex curvature of the semiconductor element in a positive-fit manner, with the first radius of the convex curvature of the second surface deviating during operation at a selected barrier layer temperature by at most 10% from a third radius of the concave cooling body curvature,
   a second way in which the cooling body surface has a convex cooling body curvature and is connected to the second surface of the concave curvature of the semiconductor element in a positive-fit manner, with the second radius of the concave curvature of the second surface deviating during operation at a selected barrier layer temperature by at most 10% from a fourth radius of the convex cooling body curvature.

2. The semiconductor assembly of claim 1, wherein the semiconductor element is operable with the selected barrier layer temperature from a range of values between from 50% of a maximum barrier layer temperature of the semiconductor element and a maximum barrier layer temperature of the semiconductor element.

3. The semiconductor assembly of claim 1, wherein the semiconductor element has a thermal expansion coefficient which is smaller than a thermal expansion coefficient of the carrier element.

4. The semiconductor assembly of claim 1, further comprising a heat-conducting material configured to smooth irregularities in a material of the second surface of the convex curvature of the semiconductor element and/or in the cooling body surface of the concave cooling body curvature of the cooling body.

5. The semiconductor assembly of claim 1, wherein the semiconductor element has a thermal expansion coefficient which is greater than a thermal expansion coefficient of the carrier element.

6. The semiconductor assembly of claim 1, further comprising a heat-conducting material configured to smooth irregularities in a material of the second surface of the concave curvature of the semiconductor element and/or in the cooling body surface of the convex cooling body curvature of the cooling body.

7. An inverter, comprising a semiconductor assembly comprising a carrier element having contacts, a semiconductor element having a first surface which faces toward the carrier element, a second surface situated opposite the first surface and having a convex curvature with a first radius or a concave curvature with a second radius, and contacts arranged on the first surface, an electrically conductive material electrically connecting the contacts of the semiconductor element to the contacts of the carrier element, and a cooling body having a cooling body surface which is connected in one of two ways, a first way in which the cooling body surface has a concave cooling body curvature and is connected to the second surface of the convex curvature of the semiconductor element in a positive-fit manner, with the first radius of the convex curvature of the second surface deviating during operation at a selected barrier layer temperature by at most 10% from a third radius of the concave cooling body curvature, a second way in which the cooling body surface has a convex cooling body curvature and is connected to the second surface of the concave curvature of the semiconductor element in a positive-fit manner, with the second radius of the concave curvature of the second surface deviating during operation at a selected barrier layer temperature by at most 10% from a fourth radius of the convex cooling body curvature,
wherein the inverter is configured for electrical connection to an electrical network and an electrical machine such that the electrical machine is operable by the inverter by electrical energy from the electrical network.

8. The inverter of claim 7, wherein the semiconductor element is operable with the selected barrier layer temperature from a range of values between from 50% of a maximum barrier layer temperature of the semiconductor element and a maximum barrier layer temperature of the semiconductor element.

9. The inverter of claim 7, wherein the semiconductor element has a thermal expansion coefficient which is smaller than a thermal expansion coefficient of the carrier element.

10. The inverter of claim 7, wherein the semiconductor assembly includes a heat-conducting material configured to smooth irregularities in a material of the second surface of the convex curvature of the semiconductor element and/or in the cooling body surface of the concave cooling body curvature of the cooling body.

11. The inverter of claim 7, wherein the semiconductor element has a thermal expansion coefficient which is greater than a thermal expansion coefficient of the carrier element.

12. The inverter of claim 7, wherein the semiconductor assembly includes a heat-conducting material configured to smooth irregularities in a material of the second surface of the concave curvature of the semiconductor element and/or in the cooling body surface of the convex cooling body curvature of the cooling body.

13. A production method for producing a cooling body for a semiconductor assembly, comprising the steps of:
determining a first radius of a convex curvature of a surface of a semiconductor element at an ambient temperature, or determining a second radius of a concave curvature of a surface of a semiconductor element at the ambient temperature, wherein in each case the surface is arranged opposite another surface of the semiconductor element in facing relation toward a carrier element that is electrically connected to the semiconductor element;
determining the first radius of the convex curvature of the surface of the semiconductor element at a selected barrier layer temperature, or determining the second radius of the concave curvature of the surface of the semiconductor element at the selected barrier layer temperature;
comparing the first radius determined at the ambient temperature with the first radius determined at the selected barrier layer temperature, or comparing the second radius determined at the ambient temperature with the second radius determined at the selected barrier layer temperature; and
producing a concave cooling body curvature of a cooling body surface of a cooling body with a third radius which is equal to the first radius at the selected barrier layer temperature when the first radius at the ambient temperature is smaller than the first radius at the selected barrier layer temperature, or producing a convex cooling body curvature of a cooling body surface of the cooling body with a fourth radius which is equal to the second radius at the selected barrier layer temperature when the second radius at the ambient temperature is greater than the second radius at the selected barrier layer temperature.

14. The production method of claim 13, wherein the semiconductor element is in an electrically inoperative state as the first radius or the second radius is determined at the ambient temperature.

15. The production method of claim 13, wherein the semiconductor element has the ambient temperature in a range of a value of more than 0° C. to 30° C. as the first radius or the second radius is determined at the ambient temperature.

16. The production method of claim 13, further comprising:
electrically operating the semiconductor element at a barrier layer temperature of less than 50% of a maximum barrier layer temperature of the semiconductor element as the first radius or the second radius is determined at the ambient temperature; and when the barrier layer temperature is higher than the ambient temperature, replacing the ambient temperature by the higher barrier layer temperature in the comparing and producing steps.

17. The production method of claim 13, wherein the selected barrier layer temperature is determined from a range of values between from 50% of the maximum barrier layer temperature of the semiconductor element and the maximum barrier layer temperature of the semiconductor element while determining the first radius or the second radius at the selected barrier layer temperature, and further comprising operating the semiconductor element at the selected barrier layer temperature.

* * * * *